United States Patent [19]
Leupold

[11] Patent Number: 5,126,713
[45] Date of Patent: Jun. 30, 1992

[54] HEMISPHERICAL CLADDING FOR PERMANENT MAGNET SOLENOIDS

[75] Inventor: Herbert A. Leupold, Eatontown, N.J.

[73] Assignee: The United States of America as represented by the Secretary of the Army, Washington, D.C.

[21] Appl. No.: 811,480

[22] Filed: Dec. 20, 1991

[51] Int. Cl.$^5$ .............................................. H01F 7/02
[52] U.S. Cl. ..................................... 335/304; 335/306
[58] Field of Search ............... 335/211, 214, 301, 302, 335/304, 306

[56] References Cited
U.S. PATENT DOCUMENTS 3,768,054  10/1973  Neugebauer ..................... 335/304
4,647,887  3/1987  Leupold .............................. 335/211
4,654,618  3/1987  Leupold .............................. 335/304
4,701,737  10/1987  Leupold .............................. 335/301

Primary Examiner—Leo P. Picard
Assistant Examiner—Ramond Barrera
Attorney, Agent, or Firm—Michael Zelenka; William H. Anderson

[57] ABSTRACT

A magnetic circuit including a structure for magnetically cladding a permanent magnet solenoid to eliminate flux leakage therefrom. The cladding includes hemispherical magnetic cladding elements located at the ends of the solenoid in order to eliminate sharp end corners and thus further suppress flux leakage from the magnetic circuit.

9 Claims, 2 Drawing Sheets

HEMISPHERICAL CLADDING FOR PERMANENT MAGNET SOLENOIDS

GOVERNMENT INTEREST

The invention described herein may be manufactured, used and licensed by or for the Government for governmental purposes without the payment to me of any royalties thereon or therefor.

BACKGROUND OF THE INVENTION

1. Field of the Invention

This invention relates generally to the field of magnetic devices and more particularly to a magnetic circuit including a structure for magnetically cladding a permanent magnet to eliminate undesirable external magnetic fields.

2. Description of the Prior Art

Various magnetic devices generating a controlled magnetic field are known to include magnetic cladding to enhance the desired controlled magnetic field as well as to reduce the external affects of the magnetic circuit on the surrounding environment due to magnetic field leakage. Various applications include, for example, electron beam devices such as klystrons, traveling wave tubes and the like, as well as nuclear magnetic resonance imaging systems.

Two examples of such devices include the teachings of U.S. Pat. No. 3,768,054, entitled, "Low Flux Leakage Magnetic Construction" issued to Wendell Neugebauer, on Oct. 23, 1973, and U.S. Pat. No. 4,647,887, entitled, "Lightweight Cladding For Magnetic Circuits", issued to H.A. Leupold, the present inventor, on Mar. 3, 1987. In both instances, magnetic flux of a first magnet is conserved by placing a second permanent magnet externally adjacent the first magnet with the magnetic fields of the second magnet perpendicular to the axis of the first magnet in order to prevent leakage of flux from the first magnet. As a result, most of the flux generated by the first magnet in directions outwardly from the main axis is redirected inwardly to increase the magnetic intensity along the main axis. Although the prior art devices such as disclosed in the Neugebauer and the Leupold patents, they inherently include structures which provide undesired levels of flux leakage for certain applications in the vicinity of their ends.

SUMMARY

Accordingly, it is an object of this invention to provide an improvement in the construction of permanent magnets wherein external leakage flux is minimized.

It is another object of the invention to provide a reduction in flux leakage from the end corners of a permanent magnet structure.

And it is still another object of the invention to provide a reduction of flux leakage from permanent magnet solenoids.

Briefly, the foregoing and other objects of the invention are achieved by the inclusion of curvilinear and more particularly hemispherical magnetic cladding elements affixed to the ends of a permanent magnet device such as a solenoid, so that sharp end corners are eliminated.

BRIEF DESCRIPTION OF THE DRAWINGS

The following detailed description will be more readily understood when considered together with the accompanying drawings in which.

DETAILED DESCRIPTION OF THE INVENTION

Figure 1:
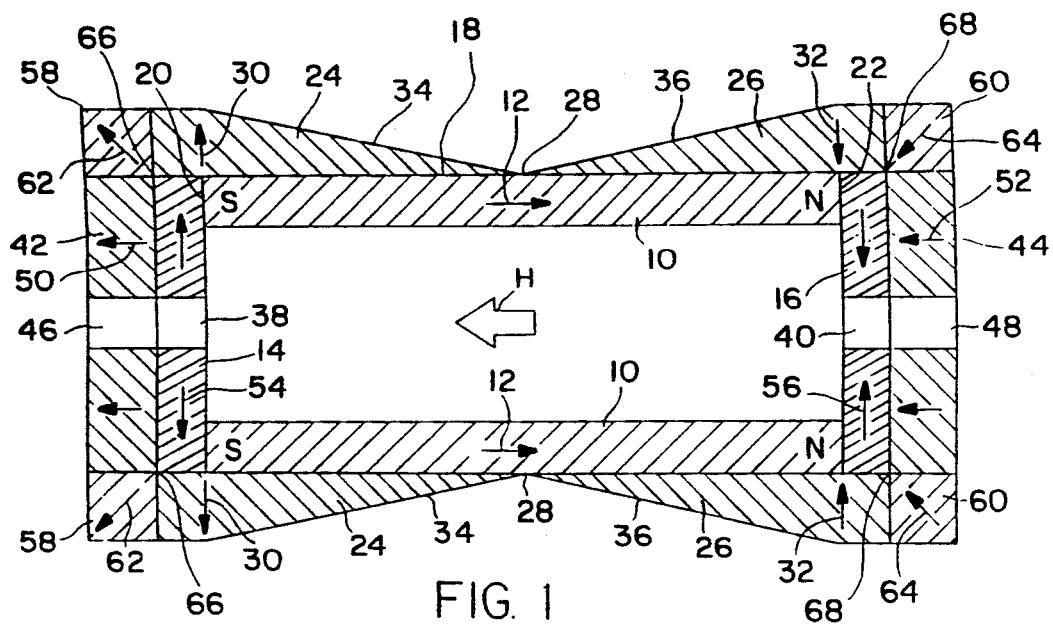
FIG. 1 is a longitudinal cross section of a known prior art cladded permanent magnet solenoid.

Referring now to the drawings and more particularly to FIG. 1, shown thereat is a prior art device of the type disclosed in U.S. Pat. No. 4,647,887, entitled, "Lightweight Cladding For Magnetic Circuits". Reference numeral 10 denotes a uniformly magnetized cylindrical permanent magnet in the form of a solenoid and having a polarity in the direction indicated by the arrow 12, that is, the flux emanating from the South Pole and (S) travels to the North Pole (N) and back. Respective circular pole pieces 14 and 16 are attached to the end faces 20 and 22 of the solenoid 10. The magnetic potential of the permanent magnet solenoid 10 along its outer surface 18 uniformly increases from the south end face 20 to the north end face 22. The magnetic potential of the magnet 10 therefore will be a minimum at end face 20 and a maximum at end face 22. As a reference, the magnetic potential at end face 20 is taken to be zero.

The solenoid magnet 10, moreover, is circumscribed by a pair of coaxially mounted uniformly magnetized cladding magnets 24 and 26 which are of a truncated conical shape. The smaller outside diameters or truncated ends of magnets 24 and 26 are adjacent each other and positioned over the intermediate circumferential portion or locus 28. The larger outside diameter or base portion of the cladding magnet 24 is positioned at the south(S) pole end adjacent the pole piece 14, while the larger outside diameter or base portion of cladding magnet 26 is located at the north(N) pole end 22 adjacent the pole piece 16. The cladding magnet 24 has a radially extending magnetic polarity in a direction indicated by the arrow 30. The arrow 30 points away from the S Pole of the magnet 24, while the arrow 32 of the cladding magnet 26 points toward the N Pole of the solenoid magnet 10. The radial magnetic potential difference across the cladding magnet 24 is opposite to that of the radial magnetic potential of cladding magnet 26. The cladding magnet 24 has a radial polarity between the surfaces 18 and 34 that will add to or complement the increasing magnetic potential of the solenoid magnet 10 from the end face 22 to the intermediate circumferential portion or locus 28. The cladding magnet 26, on the other hand, has a radial polarity between the surfaces 18 and 36 that will subtract from or counter the increasing magnetic potential of the solenoid magnet 10 from the locus 28 to the end face 22

The radial magnetic potential difference of cladding magnet 24 between the surfaces 18 and 34 increases with increasing radial thickness. Cladding magnet 24 will therefore have a maximum radial magnetic potential difference at the end face 20, at its maximum radial thickness, and a zero radial magnetic potential difference at the intermediate locus 28 at its zero radial thickness. In a like manner, the radial magnetic potential difference of cladding magnet 26 between the surfaces 18 and 36 also increases with radial thickness. Therefore, cladding magnet 26 will have a maximum radial magnetic potential difference at the end face 22, at its maximum radial thickness and a zero radial magnetic potential difference at the locus 32 at its zero radial thickness.

The radial thickness of cladding magnet 24 is chosen to vary while progressing in the axial direction at the same rate that the solenoid magnet 10 increases in potential from the S Pole to the locus 28. The radial thickness of magnet 24 will therefore vary linearly along its longitudinal extent because the axial magnetic potential of the solenoid magnet 10 varies linearly along its longitudinal extent. The radial thickness of the cladding magnet 24 is also chosen so that the radial magnetic potential rise between the surfaces 18 and 34 at the S Pole end 20 is equal to the magnetic potential drop between the intermediate circumferential portion or locus 28 and the end 20. This will result in the potential between the surfaces 18 and 34 at the end 20 being equal and opposite to the magnetic potential between the end 20 and the intermediate circumferential portion or locus 28. A similar analysis can be used for the other end of the magnetic solenoid 10, circumscribed by the cladding magnets 26 and 20 Since the magnetic potential along the surfaces 34, 36 of the cladding magnets 24 and 26 are constant, a result in a reduction of magnetic flux leakage radially from the side of the magnetic circuit will result.

The magnetic field H generated within the axial cavity of the solenoid magnet 10 can be used to, for example, contain an electron beam, not shown, passing through the apertures 38, 40. Flux leakage from the ends is suppressed by a pair of flat circular cladding magnets 42 and 44 contiguous with the pole pieces 14 and 16. The cladding magnets 42 and 44 also include apertures 46 and 48 which ar aligned with the apertures 38 and 40 in the pole pieces 14 and 16. The arrows 50 and 52 respectively point away from the flux arrows 54 and 56 at S and N poles, respectively. Corner cladding magnets 58 and 60 and which may be in the form of a ring of rectangular cross section, are affixed to the ends of the structure so that the cladding magnet 58 is contiguous with the end surfaces of the cladding magnets 24 and 42, while the cladding magnet 60 is contiguous with the end surfaces of the cladding magnet 26 and 44. The cladding magnets 58 and 60 act to prevent magnetic flux leakage due to the varying potential on the intersecting surfaces of the cladding magnets 24, 42, and 26, 44, respectively. Thus, substantially the entire outer surface of the permanent magnet solenoid 10 is cladded.

Figure 2:
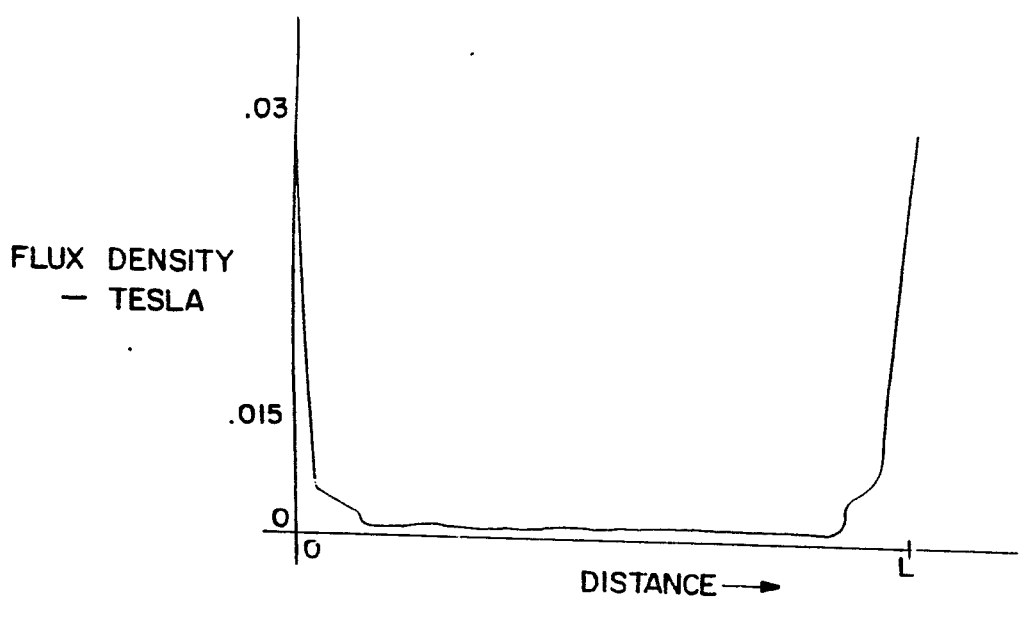
FIG. 2 is a characteristic curve illustrative of the flux leakage at each end of the device shown in FIG. 1.

Notwithstanding these attempts to eliminate magnetic flux leakage, leakage still occurs due to the square corners provided by the magnetic cladding structure shown in FIG. 1. By reference to FIG. 2, it can be seen that the flux density is in the order of .03 Tesla at the corners 66 and 68 of FIG. 1. This imperfect cladding arrangement is due largely to the approximation made by the diagonal magnetic orientations in the ring cladding magnets 58 and 60. Elsewhere along the length of the structure, the leakage This now leads to a consideration of the preferred embodiments of the invention which is directed to the replacement of the sharped edged pole pieces 14 and 16 and the end cladding magnets 42. 44 and 58. 60, with hemispherical magnetic components as shown in FIGS. 3 and 5.

Figure 3:
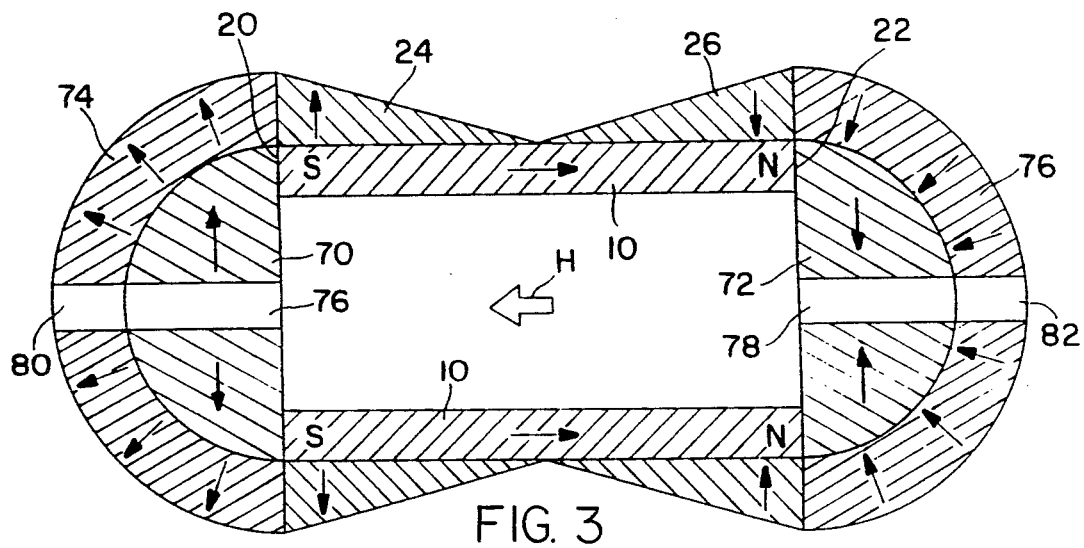
FIG. 3 is a longitudinal cross section of a preferred embodiment of the subject invention.

Referring now to FIG. 3, a pair of solid hemispherical pole pieces 70 and 72 are secured to the South pole and North pole end faces 20 and 22 of the cylindrical solenoid permanent magnet 10. This is also accompanied by contiguous externally affixed hemispherical cladding magnets 74 and 76. The thickness of the cladding magnets 74 and 76 is equal to the maximum radial thickness of the intermediate cladding magnets 24 and 26. Such a configuration eliminates the sharp corners that make necessary approximations in the cladding structure. Further as shown, coaxial apertures 76, 78 exist in the pole pieces 70 and 72 along with apertures 80, 82 in the hemispherical magnetic cladding caps 74 and 76, which permit an electron stream, for example, to pass through the device under the influence of the internal magnetic field H.

Figure 4:
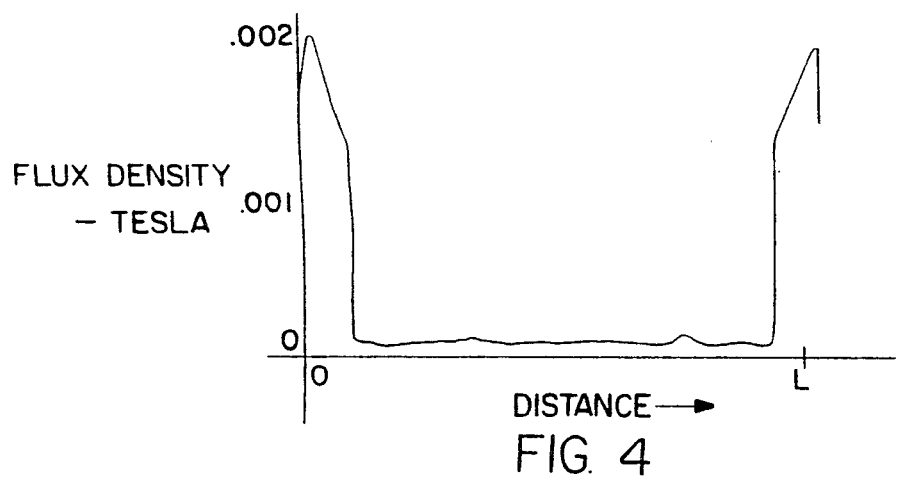
FIG. 4 is a characteristic curve illustrative of the flux leakage at the ends of the device shown in FIG. 3.

Experimental results with such a configuration have indicated that the maximum leakage field at the ends of a structure as shown in FIG. 3 has been reduced from .03 Tesla to 0.002 Tesla as shown in FIG. 4, which is a significant improvement.

Figure 5:
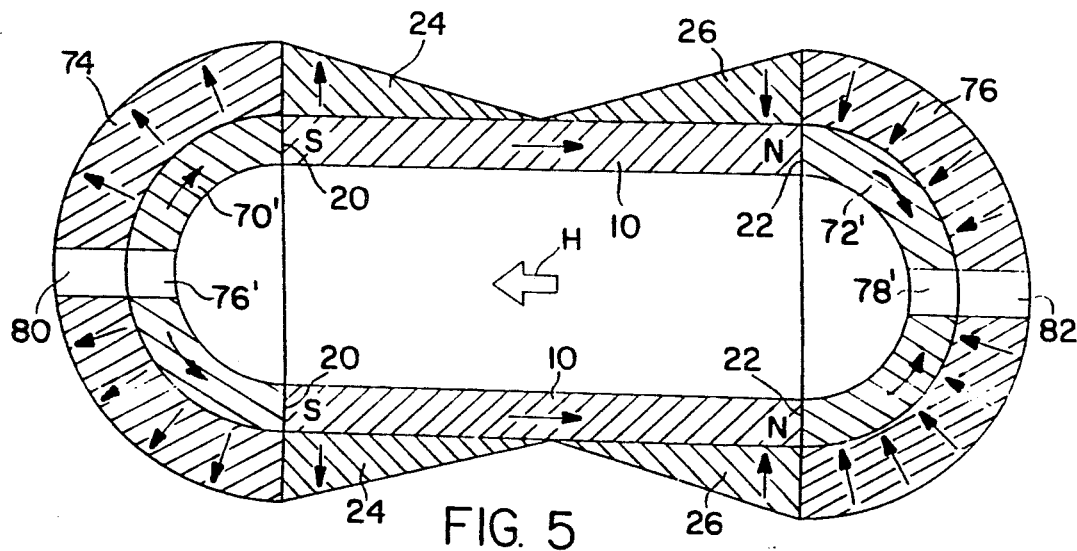
FIG. 5 is a longitudinal cross section of a second modification of the embodiment shown in FIG. 3.

While the iron pole pieces 70 and 72 under the spherical cladding magnets 74 and 76 are shown as solid members in FIG. 3, these pole pieces can be made hollow in the form of hemispherical shells 70' and 72' as shown in FIG. 5 in order to save weight. It is only necessary that the thickness of the shells 70' and 72' including the apertures 76' and 78', be sufficient to ensure that an equal potential surface is provided at the boundary of the surfaces walls 20 and 22.

Thus what has been shown and described is an improvement in permanent magnet solenoids wherein hemispherical cladding is utilized to reduce flux leakage from magnetic field working spaces.

Having thus shown and described what is at present considered to be the preferred embodiments of the invention, it should be noted that the same has been made by way of illustration and not limitation. Accordingly, all modifications, alterations and changes coming within the spirit and scope of the invention are herein meant to be included.

What is claimed is:

1. A magnetic structure having low magnetic leakage comprising:
    a longitudinally extended first magnet having a longitudinal magnetic polarity and at least two ends;
    a magnetic means for creating a constant magnetic potential along a substantial portion of the length of said first magnet on the exterior surface of said magnetic structure, said magnetic potential having strength equal to a magnetic potential of said first magnet at a circumferential point between the ends of said first magnet; and
    hemispherical cladding magnets positioned at each end of said first magnet.

2. A magnetic structure according to claim 1 further comprising curvilinear pole pieces nested within said hemispherical cladding magnets and positioned at each end of said first magnet.

3. A magnetic structure according to claim 2 wherein said hemispherical cladding magnets include hemispherical inner and outer surfaces and each said pole pieces include a hemispherical outer surface contiguous with a respective hemispherical inner surface of said cladding magnets.

4. A magnetic structure according to claim 3 wherein each pole piece includes respective curvilinear inner surfaces.

5. A magnetic structure according to claim 4 wherein each said hemispherical cladding magnet comprises magnets of a substantially constant thickness.

6. A magnetic structure according to claim 4 wherein each pole piece comprise pole pieces of substantially constant thickness.

7. A magnetic structure as in claim 1 wherein said circumferential point is located substantially at a magnetic midpoint of said first magnet.

8. A magnetic structure as in claim 1 wherein said first magnet comprises a permanent magnet solenoid uniformly magnetized along its longitudinal magnetic polarity, and said circumferential point is located substantially half way between the ends of said solenoid.

9. A magnetic structure as in claim 1 wherein said magnetic means comprises at least two permanent magnets which are of a truncated conical shape having juxtaposed truncated ends.

* * * * *